United States Patent [19]
Imura

[11] 3,949,294
[45] Apr. 6, 1976

[54] LEVEL INDICATING SYSTEM
[75] Inventor: Shigeru Imura, Tokyo, Japan
[73] Assignee: Sony Corporation, Tokyo, Japan
[22] Filed: Sept. 23, 1974
[21] Appl. No.: 508,219

[30] Foreign Application Priority Data
Sept. 28, 1973 Japan.......................... 48-112489[U]

[52] U.S. Cl............... 324/103 P; 324/115; 324/119
[51] Int. Cl.$^2$................... G01R 19/16; G01R 19/22
[58] Field of Search..... 324/103 P, 119, 115, 123 R

[56] References Cited
UNITED STATES PATENTS

| | | | |
|---|---|---|---|
| 3,529,240 | 9/1970 | Sanders............................... | 324/119 |
| 3,783,379 | 1/1974 | Nestorovic........................ | 324/103 P |
| 3,822,399 | 7/1974 | Grund et al. ..................... | 324/103 P |
| 3,842,345 | 10/1974 | Padgitt et al. .................... | 324/103 P |

Primary Examiner—R. V. Rolinec
Assistant Examiner—Ernest F. Karlsen
Attorney, Agent, or Firm—Lewis H. Eslinger; Alvin Sinderbrand

[57] ABSTRACT

A level indicating system adapted to provide an indication of the peak-level or the volume unit level of an input signal. The system is comprised of an amplifier to receive the signal; a first changeable time constant circuit; a second changeable time constant circuit coupled to the first time constant circuit; an indicator connected to the second time constant circuit; and a control circuit for changing the respective time constants of the first and second time constant circuits. The indicator selectively provides an indication of the peak-level of the signal or the volume unit of the signal depending upon the particular time constants of the time constant circuit.

12 Claims, 1 Drawing Figure

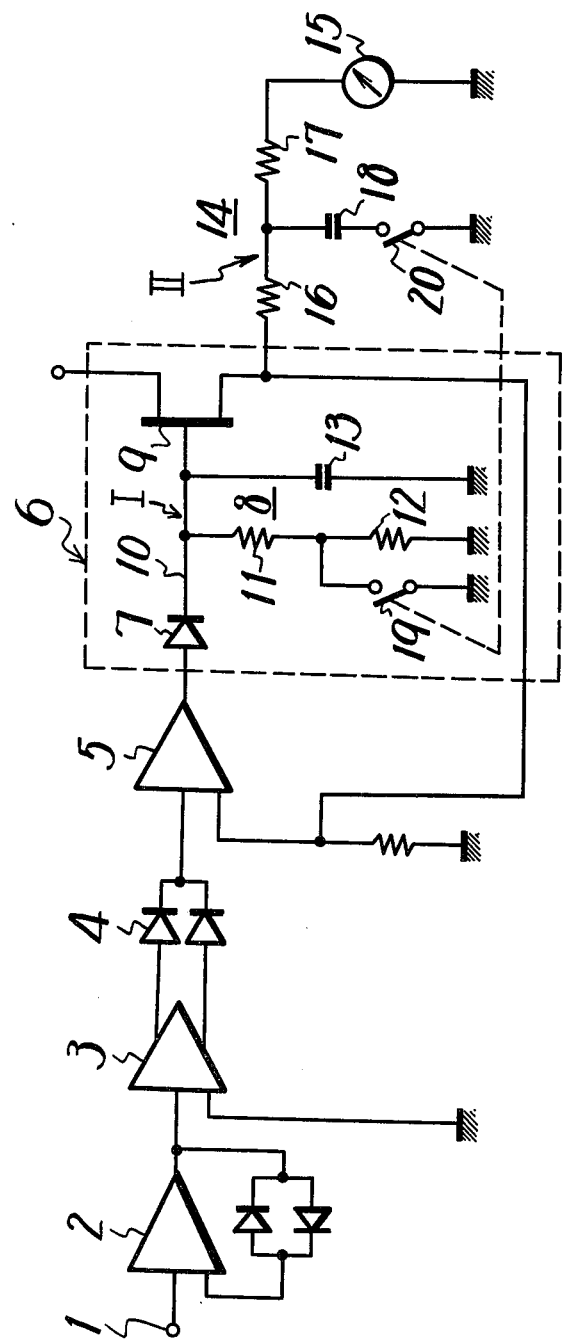

LEVEL INDICATING SYSTEM

BACKGROUND OF THE INVENTION

This invention relates to a level indicating system and, in particular, to a level indicating system which is selectively operable to provide an indication of the peak-level of a signal or the volume unit of said signal.

In sound signal processing techniques, such as in recording audio signals or mixing audio signals, it is often desireable to obtain an indication of the peak value of the audio signal and/or an indication of the resultant volume of the sound. Heretofore, such indications have usually required individual indicators, such as a peak-level indicator and a VU indicator. The VU indicator provides an indication of volume units which is a measure of the audio power of a sound signal. The VU indication is in correspondence with the sense of hearing of the reproduced sound. By providing peak-level and VU indications the optimum level of the processed audio signals can be determined and the desired sound processing can be readily achieved.

To provide an indication of the peak-level of a signal, a suitable detector usually requires a relatively rapid rise time to permit a rapid response to the changes of the input signal and a relatively slow decay time to thereby permit a response only to the peak-levels of the input signal. A conventional peak-detecting circuit exhibits the necessary time constant characteristics to provide indications of signal peak-levels. A VU indicator, however, provides an indication of the power levels included in the input signal and thus requires a response characteristic having a relatively slow rise time and a relatively rapid decay time. Conventional filter and time constant circuits having such response characteristics are well known.

As both peak-level indications and VU indications are often quite desirable for the aforenoted reasons, it is advantageous to provide a single device that is readily capable of providing both types of indications. Since the significant differences between a peak-level indicator and VU indicator reside in the differences in rise and decay time characteristics, it might be thought that a combined indicator could be formed by a diode and resistor in series with an amplifier, the resistor having a variable resistance value so as to change the time constant of the circuit. Depending upon the particular resistance value thereof, the time constant of the circuit could exhibit a relatively rapid rise time and a slow decay time, characteristic of a peak-level indicator. The same circuit, after a change in the resistance value thereof, could then exhibit a relatively slow rise time and a rapid decay time, characteristic of a VU indicator. However, it is advantageous to dispose this circuit in a feedback loop for the amplifier to thereby achieve desired circuit operation. An attendant disadvantage with such feedback loop is that, as the resistnce value is changed, the gain of the feedback loop is correspondingly varied. Accordingly, the output signal produced when the circuit is operated as a peak-level indicator would exhibit a value that is unrelated to the output signal produced when the circuit is operated as a VU indicator. This discrepancy would thus provide different indications for the same input signal value and would thus lead to erroneous signal processing.

As an alternative to the aforenoted circuit, a combined peak-level and VU indicator might be formed of a peak-detecting circuit having an output transmitted through a field effect transistor (FET) and then through a single time-constant circuit to an indicating device. In this proposal, the single time-constant circuit can exhibit variable time constant characteristics so that the indicator could be operated with first time constant characteristics having a relatively rapid rise time and a slow decay time, whereby peak-level indications are provided; and the indicator could be operated with second time constant characteristics having a relatively slow rise time and a rapid decay time, whereby VU indications are provided. The particular time constant characteristics can, of course, be determined in accordance with the particular parameters selected for the single time-constant circuit. Although the ultimate output signals produced by such a circuit are, of course, dependent upon the specific circuit design, it is usual for such circuit to provide a VU indication that is approximately 4dB lower than the peak-level indication. Although calibration of the indicator device, such as an indicating meter, might compensate for such divergence in the signal level indications, it is often quite difficult to bring the reference calibration for the peak-level indicator into correspondence with that of the VU indicator.

OBJECTS OF THE INVENTION

Therefore, it is an object of the present invention to provide an improved signal level indcating system wherein a single indicating device can be used to provide peak-level and VU indications.

It is another object of the present invention to provide an improved signal level indicating system wherein the aforenoted disadvantages of prior systems are avoided.

Yet another object of this invention is to provide a combination peak-level and VU indicator wherein peak-level and VU indications are attained merely by changing the time constant characteristics of a time-constant circuit included in the indicator.

A still further object of this invention is to provide apparatus for selectively indicating the peak-level and the power-level of a signal and having a level indicating device which admits of the same calibration for peak-level indications and for power-level indications.

It is a still further object of this invention to provide an improved level indicating system wherein peak-level indications and VU indications are selectively obtained by a circuit admitting of simple and inexpensive construction.

Various other objects and advantages of the present invention will become apparent from the ensuing detailed discription, and the novel features will be particularly pointed out in the appended claims.

SUMMARY OF THE INVENTION

A signal level indicating system adapted for providing a peak-level indication and a VU indication of an input signal, including a first time constant circuit supplied with the input signal through an amplifier, the first time constant circuit having a changeable time constant; a second time constant circuit coupled to the output of the first time constant circuit by an active element, the second time constant circuit having a changeable time constant; and wherein the respective time constants are simultaneously changed so that an indicator connected to the output of the second time constant circuit selectively provides a peak-level indication or a VU indication of the input signal.

BRIEF DESCRIPTION OF THE DRAWINGS

The following detailed description will best be understood in conjunction with the accompanying drawing FIGURE which is a schematic diagram of one preferred embodiment of the level indicating system in accordance with the present invention.

DETAILED DESCRIPTION OF A CERTAIN ONE OF THE PREFERRED EMBODIMENTS

Referring now to the drawing, the schematic diagram therein represents a typical signal processing system. In a preferred application thereof, the signal processing system is adapted to receive an audio signal and to provide indications of the level of the received audio signal. Such indications are useful in facilitating the processing and manipulation of the audio signal, as in signal recording, signal mixing, and the like. Although knowledge of various signal characteristics are helpful, the illustrated circuitry comprises a signal level indicating system whereby the peak-level and the power-level of the input audio signal are indicated. Such indications are generally referred too as peak-level indications and VU indications. A VU indication represents the volume unit level of the input signal and is thus indicative of the audio power levels therein.

The illustrated circuitry is comprised of a logarithmic amplifier 2, an ac amplifier 3, a full-wave rectifier 4 and a peak-detector 6. As illustrated, the logarithmic amplifier 2 is adapted to receive the input signal supplied thereto by an input terminal 1. The logarithmic amplifier 2, including the illustrated feedback circuitry, is conventional, as is the ac amplifier 3 which is connected to the output of the logarithmic amplifier. The ac amplifier is, in turn, connected through the full-wave rectifier 4, here illustrated as a pair of diodes connected in a conventional full-wave recitifing circuit, to the amplifier 5. The amplifier 5 is connected for stable operation and includes a feedback circuit including the peak detector circuit 6 therein.

The peak detector circuit 6, which is included in the feedback loop of the amplifier 5, is comprised of a rectifier 7 connected to a time-constant circuit 8. In particular, the anode of the rectifier 7 is connected to the amplifier 5 and the cathode of the rectifier is connected through the time constant circuit 8 to a reference potential, such as ground. The time constant circuit 8 is comprised of a resistance connected in parallel with a capacitance 13. Preferably, the resistance is formed of series-connected resistors 11 and 12. As will soon become apparent, the resistance can be formed of additional resistors connected in series or, alternatively, with various parallel-connected resistance devices. Thus, the parallel circuit formed of the capacitance 13 and the series-connected resistors 11 and 12 is connected via a conducting lead 10 to the cathode of the rectifier 7. The time constant of the illustrated time-constant circuit 8 is seen to be a function of the total resistance value of resistors 11 and 12 and the total capacitance value of the capacitance 13. It is thus appreciated that the time constant of the illustrated time-constant circuit can be varied merely by changing a selected one or more of the resistance values of the illustrated resistance. In a preferred embodiment of the present invention, such change in the resistance value is effected by switching into (or out of) the time-constant circuit, certain predetermined resistors. In one simplified arrangement adapted to perform such switching operation, a switching mechanism 19 is connected in parallel with the resistor 12. The switching mechanism may comprise a conventional electromechancial relay switch, solid-state electronic switch, or the like. As is appreciated, when the switch is actuated so as to assume its closed position, the resistor 12 is effectively by-passed, whereby the resistance value of the time-constant circuit 8 is reduced. Conversely, when the switch 19 is deactuated, or opened, the resistor 12 is effectively inserted in series with the resistor 11 to thereby increase the resistance value of the time-constant circuit 8. Various other resistance switching configurations will, of course, become apparent, such as a plurality of resistors connected to various taps of a multiple tap selecting switch, an active resistance switching circuit, such as a switchable impedance transistor device, or the like. It is thus seen that the illustrated time-constant circuit is merely representative of such alternative configurations.

The output of the time-constant circuit 8 is connected through an active element 9 to another time-constant circuit 14. Additionally, the active element connectes the output of the first time-constant circuit 8 in a feedback loop of the amplifier 5. In the preferred embodiment illustrated herein, the active element 9 comprises a field effect transistor (FET) having a gate electrode connected to the junction defined by the rectifier 7 and the time-constant circuit 8, a drain electrode connected to a suitable supply of energizing potential and a source electrode which is connected as the output terminal of the peak detector circuit 6. In the illustrated circuit, the FET is disposed in source-follower configuration having the well understood operating characteristics intrinsic thereto.

The time-constant circuit 14 is connected to an indicating device 15, such as an indicating meter, or the like, and is comprised of a resistance connected in series with the indicating device 15 and a capacitance 18 adapted to be connected in shunt relationship with the resistance. In the illustrated preferred embodiment, the resistance comprises series connected resistors 16 and 17. The capacitance 18 is connected to the junction defined by these series-connected resistors and is adapted to be coupled to ground via switch 20. The switch 20 is similar to the aforedescribed switch 19 and, as illustrated, the respective switches are ganged for simultaneous operation. Accordingly, whereas the time-constant circuit 8 is connected within the feedback loop I of the amplifier 5, the time-constant circuit 14 is connected without this feedback loop.

As is recognized, the switch 20 is adapted, when operated, to vary the time-constant characteristics of the time-constant circuit 14. More particularly, when the switch 20 is actuated, or closed, the capacitance 18 is connected in shunt relationship with the resistors 16 and 17 to thereby change the electrical parameters of that time constant circuit, whereby a relatively slow rise time and a rapid decay time are exhibited. Since the rise time is a function of the resistor 16 and the decay time is a function of the resistor 17, this means that the resistor 17 must have a smaller resistance value than the resistor 16. However, when the switch 20 is deactuated, or opened, the effective shunt capacitance of the time-constant circuit 14 is substantially reduced, whereby the resistors 16 and 17 function as conventional signal level attenuating elements.

It should thus be readily understood that the time-constant circuits 8 and 14 are each comprised of RC networks, exhibiting different time constant characteristics, and wherein the respective electrical parameters of each time-constant circuit is varied in accordance with the operation of the associated switches 19 and 20. As the time constant characteristics are varied, the indications of the input signal level, as provided by the indicator 15, are correspondingly varied. Thus, and as will be described below, peak-level indications and VU indications are provided as a function of the operation of the switches 19 and 20.

Let it first be assumed that the switches are both deactuated. In this mode, the switches 19 and 20 are open, as illustrated. Thus, the capacitance 18 is open-circuited in the time-constant circuit 14 such that the time-constant circuit 14 is effectively comprised of the resistors 16 and 17. As such, the time constant characteristics of the circuit 14 have no appreciable affect upon the signal supplied therethrough to the indicator 15. However, the time-constant circuit 8 now admits of a relatively higher resistance value so that the time constant characteristic thereof is affected accordingly. In particular, the time-constant circuit 8 now admits of a relatively rapid rise time and a slow decay time. The combination of the rectifier 7 and the time-constant circuit 8 is thus seen to be operable as a peak detector. Accordingly, the capacitance 13 rapidly charges to the peak level of the input signal supplied thereto through the amplifier 5. As the peak level of the input signal falls below the charged level of the capacitance 13 the capacitance slowly discharges through the series-connected resistors 11 and 12 at a discharge rate determined by the resistance value of the series-connected resistors. As is appreciated, when the peak level of the signal supplied through the amplifier 5 exceeds the level to which the capacitance 13 is then charged, the capacitance is further charged. Consequently, a signal representing the peak level of the input signal is supplied through the active element 9 and through the resistors 16 and 17 to the indicator 15. Since the capacitance 18 is now effectively removed from the time-constant circuit 14, the latter time-constant circuit merely acts to attenuate the peak-level indication supplied therethrough. The indicator 15 now provides a suitable indication of the peak level of the input signal applied to the input terminal 1.

Let is now be assumed that the switches 19 and 20 are actuated so as to admit of their closed position. It is appreciated that the rise time constant of the time-constant circuit 8 is a function of the impedance of the rectifier 7 and the capacitance 13. Consequently, when the switch 19 is closed, the rise time of the time-constant circuit 8 is not affected. Thus, the rise time characteristic of the circuit 8 is substantially the same regardless of the actuation or deactuation of the switch 19. However, it is recognized that the capacitance 18 is now effectively connected in shunt relationship with the resistance of the time-constant circuit 14. Consequently, the electrical parameters of the time-constant circuit 14 are varied. In particular, the rise time characteristics of the time-constant circuit 14 is a function of the resistance value of the resistor 16 and the capacitance value of the capacitance 18.

Now, although the peak detector circuit 6 operates in conventional manner such that the capacitance 13 rapidly charges to the peak value of the input signal, the charged value provided at the capacitance 13 is transmitted through the time-delay circuit 14 which exhibits a relatively slow rise time. The actuation of the switch 19 has altered the electrical parameters of the time-constant circuit 8 to the extent that the resistance value is decreased because of the effective removal of the resistance 12 from the circuit. Consequently, the decay time constant characteristic of the circuit 8 which had heretofore been relatively slow is now made relatively rapid. Therefore, the input signal supplied through the amplifier 5 to the indicator 15 is seen to be operated upon by the time constant circuit 8 and 14 which have a cumulative characteristic of a relatively slow rise time and rapid decay time. Hence, the indicator 15 now functions as a VU indicator whereby the audio power levels of the input signal are indicated thereby.

Thus, it is seen that the illustrated signal level indicating system functions as a peak-level indicator when the switches 19 and 20 are deactuated, and as a VU idicator when the switches are actuated. It should be readily appreciated that various alternative switching configurations are contemplated whereby the electrical parameters of the RC networks comprising the respective time constant circuits are altered so as to achieve a corresponding signal level indication. In the preferred embodiment, a change in the function of the signal level indicating system, i.e., from a peak-level indicator to a VU indicator, does not require further calibration of the indicating device 15. That is, the indicating device need not be recalibrated for each change in the functional mode of operation of the system. By exploiting the combined effects of the first and second time-constant circuits, th resultant signal level indication provides an accurate representation of the corresponding signal level of the input signal for all signal input values. In particular, for a given input value, the resultant peak-level indication and VU indication are in full correspondence. Furthermore, since the peak-level indicator is often operated in combination with a logarithmic amplifier, the VU indicator, operated with such logarithmic amplifier, is thereby provided with a wide range of VU levels of indication.

While the invention has been particularly shown and described with reference to a certain preferred embodiment thereof and a particular application thereof, it will be obvious to those of ordinary skill in the art that the present invention admits of general application for providing indications of signal levels of a wide variety of input signals. Indications may thus be provided of the peak-levels and power levels of an input signal. Moreover, various changes and modifications in form and details may be made without departing from the spirit and scope of the invention. For example, and as noted above, various alternative switching mechanisms can be provided to selectively vary the electrical parameters of the respective time-constant circuits. Also, any suitable indicating mechanism can be provided to manifest an indication of the signal level of the input signal. Still further, although a logarithmic amplifier is preferable, the present invention need not be limited to a level indicating system wherein such an amplifier is a necessity. Therefore, it is intended that the appended claims be interpreted as including the foregoing and other such changes and modifications.

What is claimed is:

1. A signal level indicating system, comprising:
an amplifier for receiving a signal whose level is to be indicated;
a first time constant circuit coupled to the output of said amplifier by a rectifier, said first time constant circuit having a changeable discharge time constant;

a second time constant circuit coupled to the output of said first time constant circuit by an active element, said second time constant circuit having a changeable charge time constant;

an indicator connected to the output of said second time constant for providing an indication of the level of the signal supplied thereto through said first and second time constant circuits; and means coupled to each of said time constant circuits for changing the respective time constants thereof.

2. A signal level indicating system in accordance with claim 1 wherein the output of said active element is fed back to said amplifier such that said rectifier, said first time constant circuit and said active element are included in a feedback loop for said amplifier; and wherein said second time constant circuit is disposed without said feedback loop.

3. A signal level indicating system in accordance with claim 1 wherein each of said time constant circuits is comprised of an RC network; and wherein said means for changing the respective time constants is comprised of first and second switch means coupled to said respective RC network for selectively changing the electrical parameters of said RC networks.

4. A signal level indicating system in accordance with claim 3 wherein said first RC network comprises first resistance means connected in parallel relation with first capacitance means, and said first switch means is connected to change the resistance value of said first resistance means; and said second RC network comprises second resistance means connected in series with said indicator, and second capacitance means and said second switch means is disposed to operably connect said second capacitance means in shunt relationship with said second resistance means; said first and second switch means being ganged for simultaneous operation.

5. A signal level indicating system in accordance with claim 4 wherein said active element comprises a field effect transistor having a gate connected in common to said rectifier and to saif first RC network and source connected to said second RC network, said source additionally being connected to said amplifier in feedback relation.

6. A combination peak-level and volume unit indicator, comprising:

an amplifier for receiving an input signal;

a peak detecting circuit coupled to said amplifier and having a relatively rapid rise time and a relatively slow decay time;

an indicator for selectively providing an indication of the peak-level and the volume unit of said input signal;

a time constant circuit coupled to said indicator;

means for connecting said peak detecting circuit to said time constant circuit; and means coupled to said peak detecting circuit and said time constant circuit and operable when activated to speed up the decay time of said peak detecting circuit and simultaneously to provide said time constant circuit with a relatively slow rise time and a relatively rapid decay time.

7. A combination peak-level and volume unit indicator in accordance with claim 6 wherein said last-mentioned means comprises switch means admitting of a first state whereby said indicator provides an indication of the peak-level of said input signal, and a second state whereby said indicator provides an indication of the volume unit of said input signal.

8. A combination peak-level and volume unit indicator in accordance with claim 7 wherein said time constant circuit comprises resistance means connected in series with said indicator and capacitance means selectively connected in shunt relation with said resistance means; said switch means including a switch for connecting said capacitance means to said resistance means in shunt relation when said switch admits of said second state and for operably disconnecting said capacitance means from said resistance means when said switch admits of said first state.

9. A combination peak-level and volume unit indicator in accordance with claim 8 wherein said peak detecting circuit comprises a rectifier connected to a shunt circuit, said shunt circuit comprising second resistance means connected in parallel with additional capacitance means; said switch means further including an additional switch for varying the resistance value of said second resistance means such that said resistance value is decreased from a higher value when said additional switch admits of said second state and said resistance value exhibits said higher value when said additional switch admits of said first state; said first and additional switches being ganged for simultaneous operation.

10. A combination peak-level and volume unit indicator in accordance with claim 9 wherein said connecting means comprises transistor means; and wherein said peak detecting circuit and said transistor means are included in a feedback loop for said amplifier.

11. Apparatus for selectively indicating the peak-level and the power-level of a signal, comprising:

an amplifier for receiving said signal;

a peak detecting circuit connected to said amplifier for detecting the peak levels of said signal and having a rise time and a decay time;

first switch means coupled to said peak detecting circuit for selectively speeding up the decay time of said peak detecting circuit;

a power-level detecting circuit having signal resistance, said power-level detecting circuit being selectively operable to detect the power level of said signal;

second switch means coupled to said power-level detecting circuit for selectively operating same, whereby said power-level detecting circuit exhibits a relatively slow rise time and a relatively rapid decay time when operated;

connecting means for connecting said peak detecting circuit to said power-level detecting circuit; and an indicator connected to said power-level detecting circuit for selectively indicating the peak-level and the power-level of said signal in accordance with the selective operation of said first and second switch means.

12. Apparatus in accordance with claim 11 wherein said peak detecting circuit comprises a rectifier connected to a shunt circuit, said shunt circuit comprising a capacitor connected in parallel with resistance, said first switch means being coupled to said resistance for selectively changing the value thereof; and said power-level detecting circuit comprises a further capacitor selectively connected to said signal resistance in shunt relation, said second switch means being coupled to said further capacitor for selectively establishing said shunt connection; said first and second switch means being simultaneously operable.

\* \* \* \* \*